US008054697B2

United States Patent
Yano

(10) Patent No.: US 8,054,697 B2
(45) Date of Patent: Nov. 8, 2011

(54) SEMICONDUCTOR STORAGE DEVICE INCLUDING A LEVER SHIFT UNIT THAT SHIFTS LEVEL OF POTENTIAL OF BIT LINE PAIR

(75) Inventor: Nobumitsu Yano, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 48 days.

(21) Appl. No.: 12/656,597

(22) Filed: Feb. 4, 2010

(65) Prior Publication Data

US 2010/0238744 A1    Sep. 23, 2010

(30) Foreign Application Priority Data

Mar. 19, 2009   (JP) .................................. 2009-067757

(51) Int. Cl.
*G11C 7/00* (2006.01)
(52) U.S. Cl. ............... 365/189.11; 365/205; 365/185.25
(58) Field of Classification Search ............. 365/189.11, 365/205, 185.25
See application file for complete search history.

(56) References Cited

U.S. PATENT DOCUMENTS

| | | | | |
|---|---|---|---|---|
| 6,392,944 B1 * | 5/2002 | Kono | ............................. | 365/208 |
| 6,411,543 B2 * | 6/2002 | Narui et al. | .................... | 365/149 |
| 6,452,833 B2 | 9/2002 | Akita et al. | | |
| 7,440,329 B2 * | 10/2008 | Ohsawa | ..................... | 365/185.2 |
| 2001/0014042 A1 * | 8/2001 | Kato et al. | .................... | 365/200 |
| 2002/0186598 A1 * | 12/2002 | Ooishi | .......................... | 365/200 |
| 2005/0162969 A1 * | 7/2005 | Hasegawa et al. | ........ | 365/230.06 |

FOREIGN PATENT DOCUMENTS

JP    2002-050181    2/2002

OTHER PUBLICATIONS

J. Barth, et al., "A 300 MHz Multi-Banked eDRAM Macro Featuring GND Sense, Bit-Line Twisting and Direct Reference Cell Write", ISSCC 2002/Session 9/DRAM and Ferroelectric Memories/9.3, 2002 IEEE International Solid-State Circuits Conference, Feb. 5, 2002.

* cited by examiner

*Primary Examiner* — Tuan T. Nguyen
(74) *Attorney, Agent, or Firm* — McGinn IP Law Group, PLLC

(57) ABSTRACT

A semiconductor storage device includes a level shift unit that shifts level of potential of bit line pair BL, $BL_B$ when a sense amplifier starts to read potential of the bit lines. The level shift unit includes level shifting capacitors and a timing generator. Each of level shifting capacitors have one electrode connected to each bit line and form one pair by two level shifting capacitors for each bit line pair. The timing generator is connected to each of the other electrodes of the level shifting capacitors in common, and supplies a shift capacitor drive signal to a common node of the other electrodes, so as to change stored electricity amount of the level shifting capacitors at a predetermined timing.

5 Claims, 7 Drawing Sheets

SEMICONDUCTOR STORAGE DEVICE INCLUDING A LEVER SHIFT UNIT THAT SHIFTS LEVEL OF POTENTIAL OF BIT LINE PAIR

INCORPORATION BY REFERENCE

This application is based upon and claims the benefit of priority from Japanese patent application No. 2009-067757, filed on Mar. 19, 2009, the disclosure of which is incorporated herein in its entirety by reference.

BACKGROUND

1. Field of the Invention

The present invention relates to a semiconductor storage device.

More specifically, the present invention relates to the structure for performing precharge when data is read out in a DRAM which is a semiconductor storage device.

2. Description of Related Art

A DRAM is known as a memory device. In typical, signal charge amount stored in the DRAM is quite small. Accordingly, in order to detect and amplify the signal charge amount of the DRAM and externally read it out, potential change of bit lines needs to be sensed with high sensitivity.

As more and more devices have been miniaturized in recent years, power supply voltage Vcc applied to the devices needs to be lowered in terms of maintaining operation reliability.

By the way, a Vcc/2 precharge system has typically been employed to read out data of DRAM.

This is disclosed, for example, in ISSCC 2002/SESSION 9/DRAM AND FERROELECTRIC MEMORIES/9.3, A 300 MHz Multi-Banked eDRAM Macro Featuring GND Sense, Bit-Line Twisting and Direct Reference Cell Write, FIG. 9.3.2. However, the following problems are raised if the voltage is lowered in a simple way with the Vcc/2 precharge system.

In the Vcc/2 precharge system, when the reading operation is completed, the potential of the bit lines is equalized and is precharged to the potential of Vcc/2 again.

In the DRAM using such a Vcc/2 precharge system, the voltage between gate and source (Vcc/2) in sense amplifier operation of the transistor that forms a sense amplifier inevitably decreases as the power supply voltage is made lower. As a result, the sense operation is greatly delayed, or may not be performed in a worst case.

For example, when Vcc=1.5 V, the voltage between gate and source (Vcc/2) of a sense amplifier transistor is 0.75 V. In practice, it is expected that the voltage decreases due to resistance of a common source line of the sense amplifier transistor, and especially in initial sensing, the voltage between gate and source is further reduced (to about 0.5 V or less).

Meanwhile, an absolute value |Vth| of a threshold voltage Vth of the sense amplifier transistor needs to be at least 0.3 to 0.5 V in order to guarantee cut-off characteristics. Further, in initial sensing, the substantial value of |Vth| is further increased in accordance with the substrate effect of the sense amplifier transistor.

Hence, the threshold voltage and the voltage between gate and source of the sense amplifier transistor in the initial sense operation are extremely close to each other. Then, the initial sense operation is considerably delayed, which is the biggest obstacle for realizing high-speed DRAM.

On the other hand, a ground precharge system has been used in recent years as a reading method by lowering the bias level of the sense amplifier. In case of the DRAM with the ground precharge system, upon completion of reading operation, the potential of the bit lines is equalized and precharged to the potential of GND. In the DRAM with such a ground precharge system, the voltage between gate and source of the sense amplifier transistor can be doubled compared with the Vcc/2 precharge system, whereby high-speed operation and stability can be maintained in the sense operation even when the power supply voltage is made lower.

Now, the configuration of the DRAM according to the related art using the ground precharge system will be described in brief.

FIG. 4 is a block diagram showing the schematic configuration of a DRAM.

FIG. 5 is a diagram showing the configuration example of a bit line precharge circuit, a reference cell, and a memory cell.

The DRAM includes a memory cell array 700.

The memory cell array 700 includes a plurality of word lines and a plurality of bit lines arranged in matrix. Then, a memory cell is arranged at each intersection of the word lines with the bit lines, and memory cells 2 are arranged in matrix.

Note that, in FIG. 5, only one bit line pair is shown for the sake of simplicity.

The DRAM further includes a decoder 600. The decoder 600 decodes control addresses A0 to Am input through an input buffer 500, and generates a memory cell selection signal WL for selecting a specific memory cell. The decoder 600 further includes a function of selecting a word line and a dummy word line connected to the specific memory cell and a reference cell that forms a pair with the specific memory cell, respectively, based on the memory cell selection signal WL, sensing data that is output or rewriting data, and performing reading/writing data from/to the specific memory cell.

The DRAM further includes a sense amplifier 200.

The sense amplifier 200 detects a difference between charge transmitted from a data storing cell capacitor Cs of the memory cell 2 and charge transmitted from a capacitor Cd in the reference cell when performing reading operation of the memory cell 2 that is selected by the decoder 600. Hence, the sense amplifier 200 reads out data in the memory cell 2.

The data read out in the sense amplifier 200 is amplified to a certain level by a main amplifier 300, and thereafter externally output as digital I/O data DQ0 to DQn through an I/O buffer 400.

Next, a precharge circuit will be described.

The bit line precharge circuit is a transistor circuit for precharging a pair of bit lines BL, $BL_B$ for selecting a specific memory cell to about a ground level.

Note that $BL_B$ indicates a bar signal of the bit line BL.

The bit line precharge circuit is formed of three bit line precharging transistors 210, 220, and 230. The transistors 210, 220, and 230 of the bit line precharge circuit are NMOS transistors. Then, each of a source and a drain of the NMOS transistor 230 is connected to a pair of bit lines BL, $BL_B$, respectively.

Further, a drain of the bit line precharging transistor 210 is connected to one bit line $BL_B$, a drain of the bit line precharging transistor 220 is connected to the other bit line BL, and sources of the bit line precharging transistors 210, 220 are connected to a common node.

To this common node, ground level of output voltage for precharging is applied.

Further, a precharge activation signal φs is input to each gate of the three bit line precharging transistors 210, 220, and 230.

Further, a reference cell precharging transistor Trc is provided to precharge the reference potential storing capacitor Cd to potential of about Vcc/2. Voltage for precharging the reference cell (Vcc/2) is applied to a source (or drain) of the reference cell precharging transistor Trc. Further, the precharge activation signal φs is input to a gate of the reference cell precharging transistor Trc.

Next, a memory cell array will be described.

One given memory cell which is a component of the memory cell array 700 has one transistor and one capacitor. This memory cell is composed of a cell transistor Tc formed of one NMOS transistor and one data storing cell capacitor Cs.

The operation of such a DRAM device will now be described.

The following operation is performed in order to write data "1" or data "0" to the memory cell 2 through the bit lines BL, $BL_B$.

First, boosted voltage is supplied from the word line WL to the gate of the cell transistor Tc to set the cell transistor Tc to the operation state. Then, charge is stored in the data storing cell capacitor Cs in accordance with "0" or "1" of data.

Further, the following operation is performed to read out data by selecting the memory cell.

Boosted voltage is supplied to the gate of the cell transistor Tc and the gate of the reference cell transistor Tr from the word line WL and the dummy word line DWL, respectively, so as to set the cell transistor Tc and the reference cell transistor Tr to the operation state.

Then, charge stored in the data storing cell capacitor Cs and the reference potential storing capacitor Cd is reallocated through a pair of bit lines BL, $BL_B$.

At this time, the potential of the pair of bit lines BL, $BL_B$ is changed.

This potential change of the bit line pair BL, $BL_B$ is detected by a sense amplifier.

SUMMARY

However, it has now been discovered that power consumption and area are increased in case of the DRAM of the ground precharge system.

The first problem is power consumption.

FIG. 6 is a timing chart showing potential change of the bit lines in one cycle of reading data and performing precharge in the related Vcc/2 precharge system.

When the capacitance of the bit line pair is indicated by Cbl, the charge amount that is supplied from the power supply voltage Vcc is (Vcc/2)·Cbl at timing of (1), and 0 at timing of (2). The reason why the charge amount becomes 0 at timing of (2) is that, if a pair of bit lines BL, $BL_B$ having the same capacitance are shorted and charged, both bit lines automatically have the voltage of Vcc/2. Accordingly, the consumed charge amount for one cycle in the Vcc/2 precharge system is (Vcc/2)·Cbl.

This consumed charge amount is proportional to the consumed current for one cycle, which means the consumed power.

Meanwhile, FIG. 7 is a timing chart showing potential change of the bit lines in one cycle of reading out data and performing precharge in the ground precharge system.

The charge amount that is supplied from the power supply voltage Vcc is Vcc·Cbl at timing of (1) and (Vcc/2)·Cd at timing of (2).

At timing of (2), extra (Vcc/2)·Cd is needed compared with the Vcc/2 precharge system.

This is because the charge amount that is referred to by the sense amplifier to judge "1" or "0" is needed for the reference cell.

Thus, the consumed charge amount for one cycle in the ground precharge system is Vcc·Cbl+(Vcc/2)·Cd.

As stated above, extra (Vcc/2)·Cd is needed in addition to the charge amount obtained by doubling the charge amount in the Vcc/2 precharge system as the charge amount for one cycle in the ground precharge system.

The second problem is that the area is increased. In summary, as the extra reference cell area is needed in the ground precharge system, the area is increased by 1.5% compared with the Vcc/2 precharge system.

The third problem is that the reference data needs to be written in the reference cell in the ground precharge system.

The voltage to write the reference data into the reference cell may be substantially the same as the voltage output from an intermediate potential generator equipped with the Vcc/2 precharge system.

However, as the charge amount of (Vcc/2)·Cd needs to be supplied to the reference cell, current supply ability that is equal to or exceeds that of the intermediate potential generator equipped with the Vcc/2 precharge system is needed.

One of other related arts includes a bit line kicker circuit shown in Japanese Unexamined Patent Application Publication No. 2002-050181.

The bit lines BL, $BL_B$ are set to Vcc/2 prior to the access to the memory cell. When the memory cell is accessed after that, the potential of the bit line to which the memory cell is connected is raised, thereafter the sense amplifier is operated. When the memory cell data is read out with the bit line kicker circuit, the bit line potential which should be at the ground level is raised in the same way in reading data "0". Then, it is difficult to read out data "0". Thus, normal reading cannot be performed.

A first exemplary aspect of the present invention is a semiconductor storage device includes a memory cell array in which a plurality of memory cells storing data are arranged, a plurality of word lines that selectively drive one of the memory cells in the memory cell array, a plurality of pairs of bit lines that transmit/receive data to/from the memory cell that is selected, a precharge circuit that precharges a bit line pair to about half of a power supply potential by equalizing potential of the bit line pair, a sense amplifier that is provided in accordance with each of the bit line pairs, and a level shift unit that shifts level of potential of the bit lines when the sense amplifier starts to read potential of the bit line pair, in which the level shift unit includes level shifting capacitors, each of which having one electrode connected to each bit line, and forming one pair by two level shifting capacitors for each bit line pair, and a timing generator that is connected to each of the other electrodes of the level shifting capacitors in common, supplies a shift capacitor drive signal to a common node of the other electrodes, so as to change stored electricity amount of the level shifting capacitors at a predetermined timing.

By employing such a configuration, the problems of the related art of increased area and increased power consumption in accordance with increase of number of devices are solved by shifting the level of the potential of the bit line pair in starting reading and increasing the gate bias of the sense amplifier while employing the Vcc/2 precharge.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Hereinafter, the exemplary embodiments of the present invention will be described with reference to the drawings.

First Exemplary Embodiment

Figure 1:
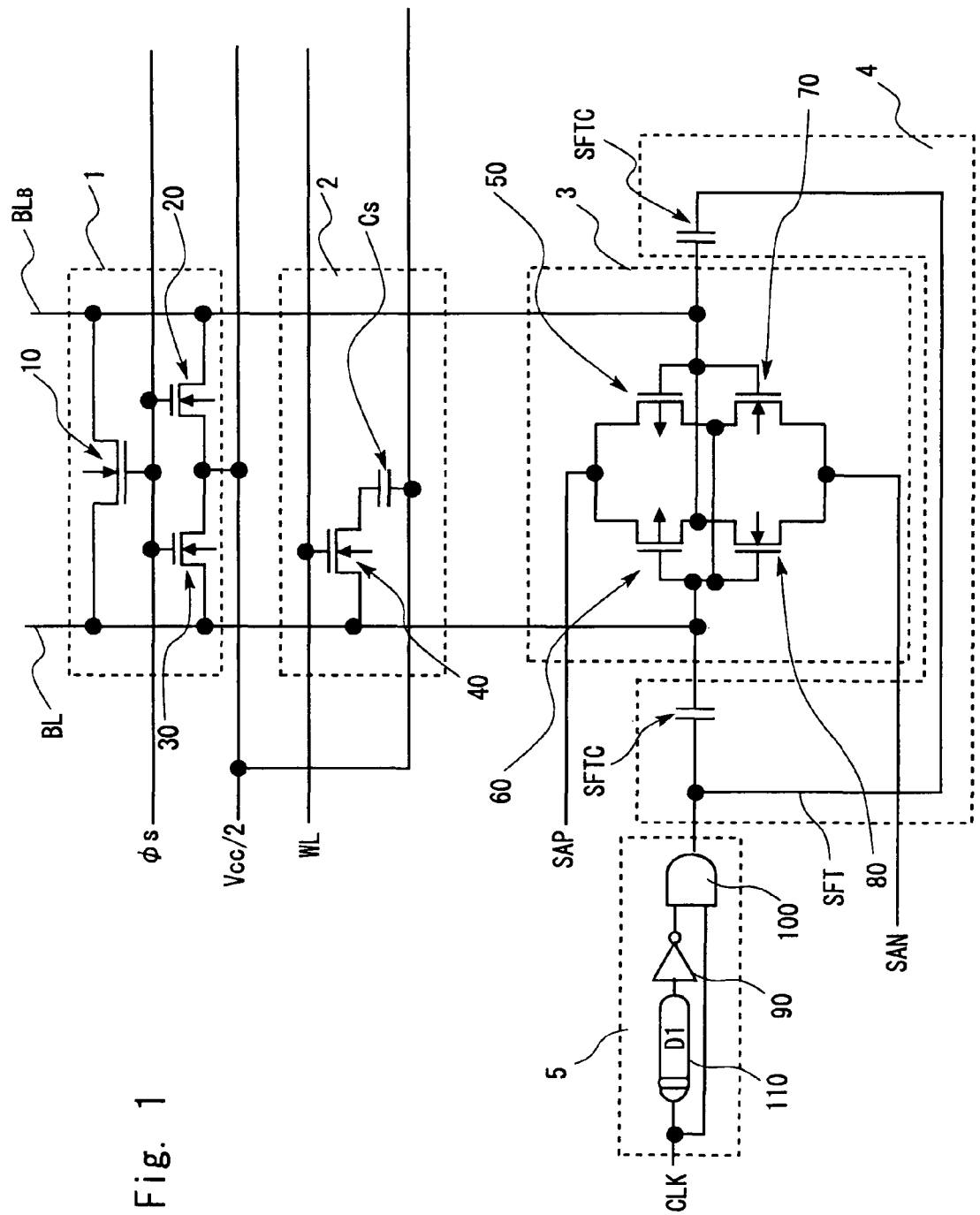
FIG. 1 shows the structure of a first exemplary embodiment.

FIG. 1 shows the structure of the first exemplary embodiment.

A DRAM includes a memory cell array 700 where a plurality of dynamic-type memory cells are arranged in an integrated manner in matrix.

For the purpose of illustration, FIG. 1 only shows one memory cell 2 and the peripheral part thereof of a memory cell array.

In FIG. 1, a plurality of word lines that selectively drive the memory cell 2 and a plurality of pairs of bit lines that supply/receive data to/from the memory cell 2 are crossed with each other and arranged in matrix. A memory cell is arranged in each intersection of the word line with the bit line pair. Only one pair of bit lines is shown in FIG. 1 for the purpose of simplicity.

The DRAM according to the first exemplary embodiment includes a bit line precharge circuit 1, a memory cell 2, a sense amplifier 3, a level shifter 4, and a timing generator 5.

The bit line precharge circuit 1 includes N channel MOS transistors 10, 20, 30. The N channel MOS transistor 10 has a gate connected to a precharge activation signal φs, a source (drain) connected to a bit line BL, and a drain (source) connected to a bit line $BL_B$. Gates of the N channel MOS transistors 20, 30 are connected to the precharge activation signal φs. Sources (drains) of the N channel MOS transistors 20, 30 are connected with each other in series, and Vcc/2 is applied to the connection point. The N channel MOS transistor 20 has a drain (source) connected to the bit line $BL_B$. The N channel MOS transistor 30 has a drain (source) connected to the bit line BL. In the bit line precharge circuit 1, when the precharge activation signal φs reaches about Vcc or more, the N channel MOS transistors 20, 30 equalize the potentials of the bit lines BL, $BL_B$ and supply potential of Vcc/2. In short, the bit line pair BL, $BL_B$ is precharged to about Vcc/2 by the bit line precharge circuit 1 when the precharge activation signal φs is input.

The memory cell 2 includes an N channel MOS transistor 40 and a data storing cell capacitor Cs. The N channel MOS transistor 40 has a drain (source) connected to the bit line BL. Note that the drain (source) of the N channel MOS transistor 40 may be connected to the bit line $BL_B$. One electrode of the data storing cell capacitor Cs is connected to the source (drain) of the N channel MOS transistor 40, and the other electrode is connected to the Vcc/2 potential. The N channel MOS transistor 40 has a gate connected to a memory cell selection signal WL. When potential of Vcc or more is applied to the gate of the N channel MOS transistor 40 as the memory cell selection signal WL, the N channel MOS transistor 40 is ON and charge in the data storing cell capacitor Cs is charged or discharged.

The sense amplifier 3 is formed of two inverters that are cross-couple connected.

A P channel MOS transistor 50 and an N channel MOS transistor 70 form one CMOS inverter, and a P channel MOS transistor 60 and an N channel MOS transistor 80 form the other CMOS inverter. The two CMOS inverters are cross-couple connected, and each gate thereof is connected to the bit lines BL, $BL_B$. Each of the P channel MOS transistor 50 and the P channel MOS transistor 60 has a source connected to a sense amplifier activation signal SAP. The sense amplifier 3 starts amplification of the difference potential of the bit line pair BL, $BL_B$ when the voltage of Vcc or more is applied as the sense amplifier activation signal SAP and the voltage of ground is applied as a sense amplifier activation signal SAN. Then, the potentials of the bit lines BL, $BL_B$ are amplified to around Vcc, and ground, respectively.

The level shifter 4 includes level shifting capacitors SFTC, SFTC that form one pair. Each of the level shifting capacitors SFTC, SFTC has one terminal connected to each of the bit lines BL, $BL_B$ and the other terminal connected to a shift capacitor drive signal SFT.

The timing generator 5 includes a delay circuit 110 to which clock CLK is input, an inverter 90 to which an output of the delay circuit 110 is input, and an AND circuit 100 to which an output of the inverter 90 and clock CLK are input. An output of the AND circuit 100 is set to the shift capacitor drive signal SFT.

Next, description will be made on combination of values of capacitance Cc of the level shifting capacitor SFTC, voltage Vcc of the sense amplifier activation signal SAP, and counter voltage $Vcc_2$ of the level shifting capacitor SFTC.

The voltage of the sense amplifier activation signal SAP is indicated by Vcc, the counter voltage of the level shifting capacitor SFTC by $Vcc_2$, the parasitic capacitance of the bit lines BL, $BL_B$ by Cbl, and the capacitance of the level shifting capacitor SFTC by Cc.

When data is read out from the memory cell 2, the counter voltage of the level shifting capacitor SFTC is switched from $Vcc_2$ to ground (GND) after completion of the precharge operation.

At this time, the potential Vbl of the bit line pair BL, $BL_B$ is indicated by the following expression.

$$Vbl = \{0.5 Vcc \cdot Cbl - (Vcc_2 - 0.5 Vcc) \cdot Cc\}/(Cbl + Cc)$$

Here, it is assumed that Vcc=1.5 V, $Vcc_2$=3 V, and the capacitance ratio of the parasitic capacitance value Cbl of the bit lines BL, $BL_B$ and the capacitance value Cc of the level shifting capacitor SFTC is Cc=0.33×Cbl, for example.

Then, the bias level of the bit lines BL, $BL_B$ with respect to the sense amplifier 3 is set to about ground level.

Further, when Vcc=$Vcc_2$=1.5V, the same result can be obtained also when Cbl=Cc.

Next, the operation timing will be described.

Figure 2:
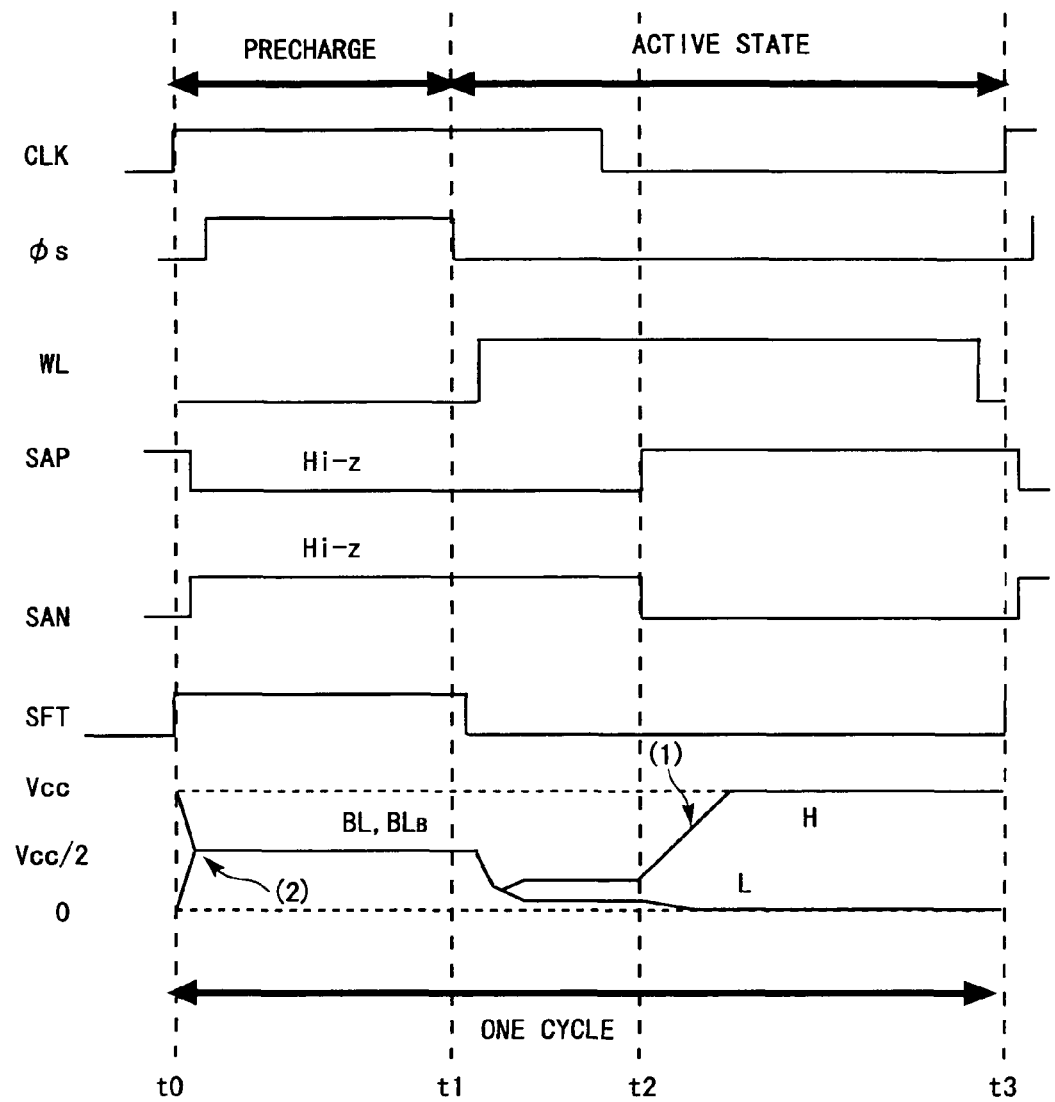
FIG. 2 shows a timing chart in executing precharge and data reading according to the first exemplary embodiment.

FIG. 2 is a timing chart when precharge and data reading are executed.

When φs is raised immediately after timing $t_0$, the bit lines BL, $BL_B$ are equalized to Vcc/2 by the bit line precharge circuit 1. Further, the potential in the connection points in the SFT sides of the level shifting capacitors SFTC are changed from the ground level to the value of $Vcc_2$ by the timing generator 5. Note that the connection points in the sides of the bit lines BL, $BL_B$ of the level shifting capacitors SFTC are kept to the level that is amplified by the sense amplifier 3 in the previous cycle even when the connection point in the SFT is changed.

The connection points in the SFT sides of the level shifting capacitors SFTC are switched from $Vcc_2$ to the ground by the timing generator 5 immediately after timing $t_1$. Then, the charge is reallocated between the capacitance Cc of the capacitor SFTC and the parasitic capacitance Cbl of the bit lines BL, $BL_B$. As a result, the connection points of the bit lines BL, $BL_B$ are set to the level which is somewhat higher than the ground level. Then, the bias level to the sense amplifier 3 is also reduced from Vcc/2 to about the ground level.

After that, the word line WL is activated and the charge stored in the memory cell 2 is reallocated between the bit lines BL, and $BL_B$. Then, the potential that exceeds Vt of the sense amplifier is supplied. The sense amplifier activation signals SAP and SAN are activated immediately after timing $t_2$, and the difference potential between the bit lines BL, and $BL_B$ is amplified to Vcc-GND by timing $t_3$ by the sense amplifier 3.

As stated above, the voltage between the gate and the source (gate bias) of the sense amplifier 3 can be made larger. As a matter of course, the gate bias can be made larger than the bias of half precharge (Vcc/2). In addition, it can be set to the level equal to the ground precharge as stated above. Further, the gate bias can be set to Vcc or more by changing the magnitude of $Vcc_2$ or the like.

In summary, according to the first exemplary embodiment, the sense amplifier can perform detection operation in high speed and without failure.

Now, power consumption according to the first exemplary embodiment will be described.

When the capacitance value of each capacitance of the bit lines is indicated by Cbl, the amount of charge that is supplied from the power supply voltage Vcc is Vcc·Cbl at timing of (1) and 0 at timing of (2).

When the shift capacitor drive signal SFT is switched from "L" to "H", the charge is reallocated between the capacitor SFTC and the bit lines BL, $BL_B$ and one bit line BL seems to exceed Vcc. However, as it is clamped by the sense amplifier, it eventually remains in Vcc.

Further, although the other bit line $BL_B$ also seems to exceed the ground level, it is clamped to the ground level by the sense amplifier. If a pair of bit lines BL, $BL_B$ having the same capacitance is shorted and charged thereafter, the both bit lines automatically have the voltage of Vcc/2. Hence, it is not needed to supply charge from the power supply voltage Vcc for precharge, and no charge is supplied from the power supply voltage Vcc at timing of (2).

As stated above, the consumed charge amount for one cycle in the precharge system according to the first exemplary embodiment is Vcc·Cb. Thus, the charge amount for one cycle in the ground precharge system which is the first problem can be improved from Vcc·Cbl+(Vcc/2)·Cc to Vcc·Cbl.

Further, as the reference cell is not needed for the detection operation in the first exemplary embodiment, the reference cell area, which is the second problem, is not needed although the shift capacitor is added.

Thus, the area overhead can be made smaller compared with the related ground precharge system.

In the first exemplary embodiment, as stated with the example above, the values of the capacitance Cc of the level shifting capacitor SFTC, the voltage Vcc of the sense amplifier activation signal SAP, and the counter voltage $Vcc_2$ of the level shifting capacitor SFTC can be combined, which means there are many ways to realize minimization of the area.

Compared with the Vcc/2 precharge system, the bias level of the sense amplifier can be set as desirable in accordance with the voltage $Vcc_2$ of the sense amplifier activation signal SAP or the capacitance value of the shift capacitor Cc, which makes design process simple.

Although the reference data needs to be written in the reference cell when there is required the reference cell (third problem), writing to the reference cell is not needed, and thus it is not needed to increase the current supply ability of the intermediate potential generator.

Second Exemplary Embodiment

Next, the second exemplary embodiment of the present invention will be described.

The basic structure of the second exemplary embodiment is similar to that of the first exemplary embodiment, and the characteristic of the second exemplary embodiment is that the delay time by the delay circuit of the timing generator is set to be longer. The delay circuit according to the second exemplary embodiment sets the delay time to be longer than that of the delay circuit 110 in the first exemplary embodiment. In short, in the first exemplary embodiment, the activation period of the drive signal SFT is immediately before the memory cell selection signal WL is activated.

Meanwhile, in the second exemplary embodiment, the activation period of the drive signal SFT is immediately before the sense amplifier is activated.

Figure 3:
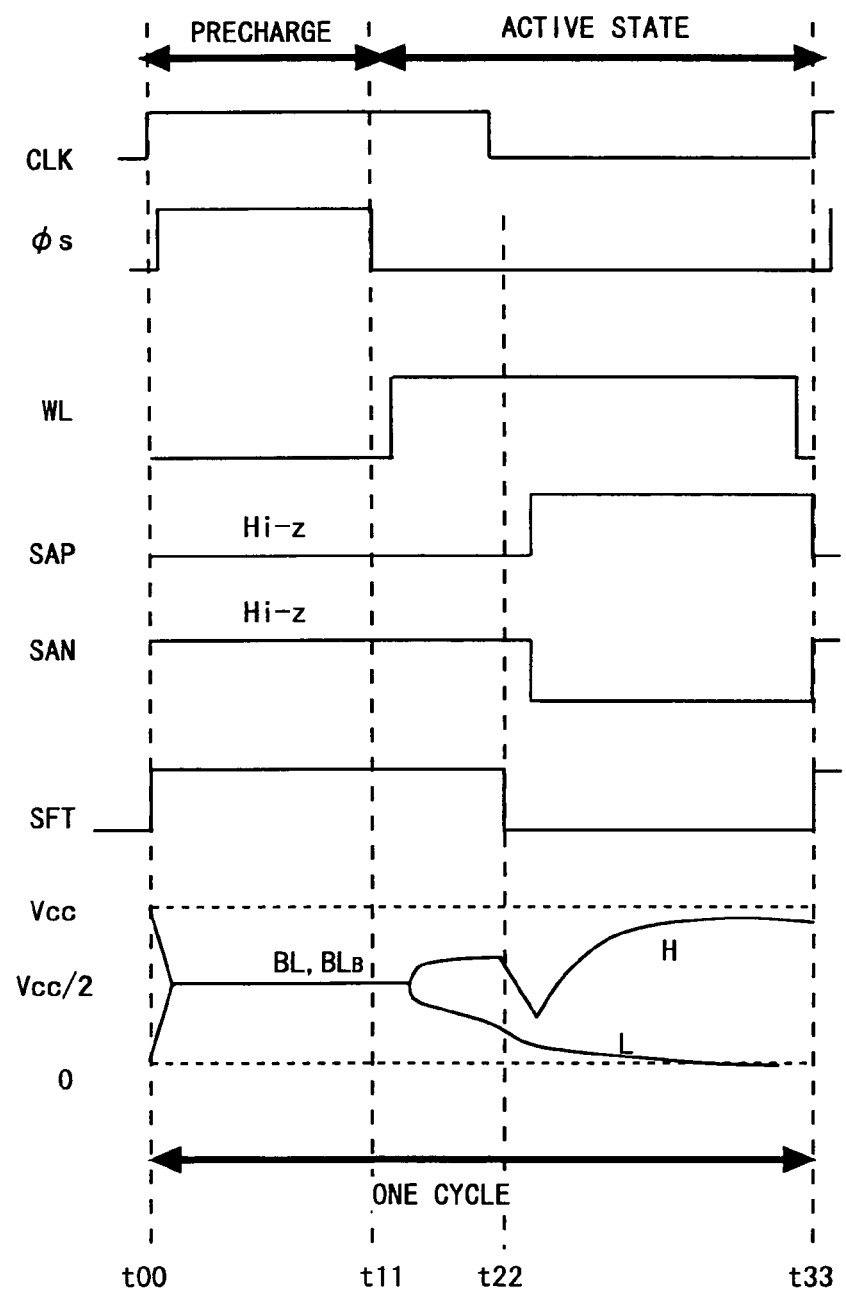
FIG. 3 shows a timing chart showing operation timing according to a second exemplary embodiment.
Figure 4:
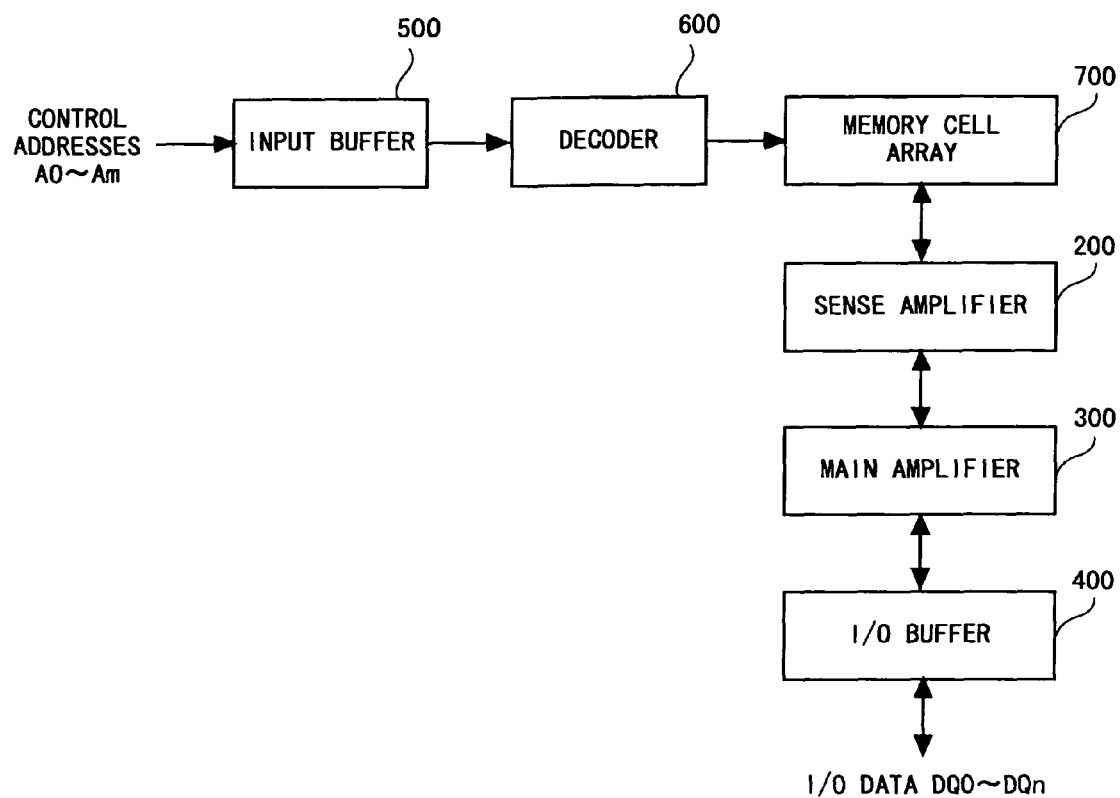
FIG. 4 shows a block diagram showing the schematic configuration of a DRAM according to a related art.
Figure 5:
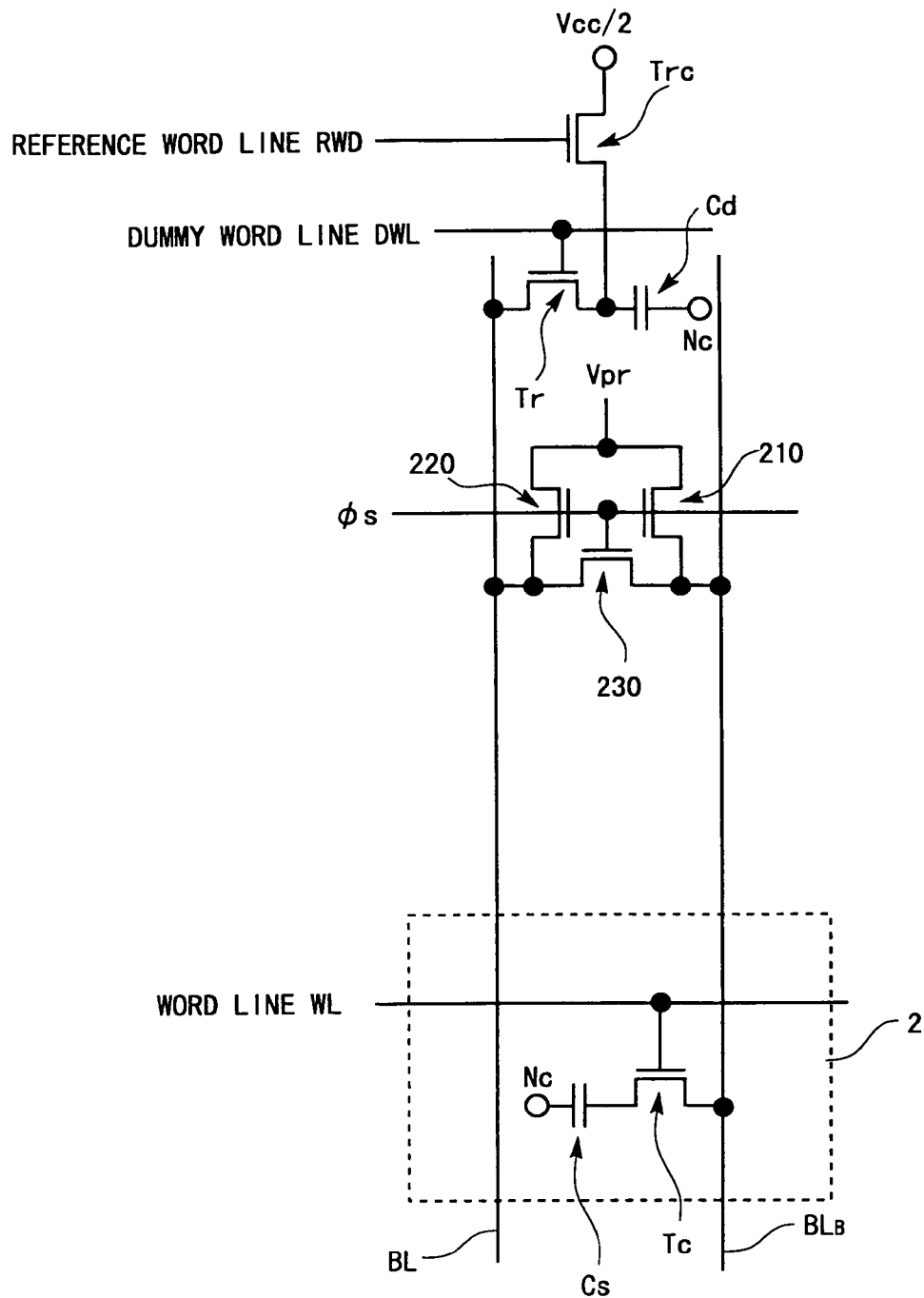
FIG. 5 shows a configuration example of a bit line precharge circuit, a reference cell, and a memory cell according to the related art.
Figure 6:
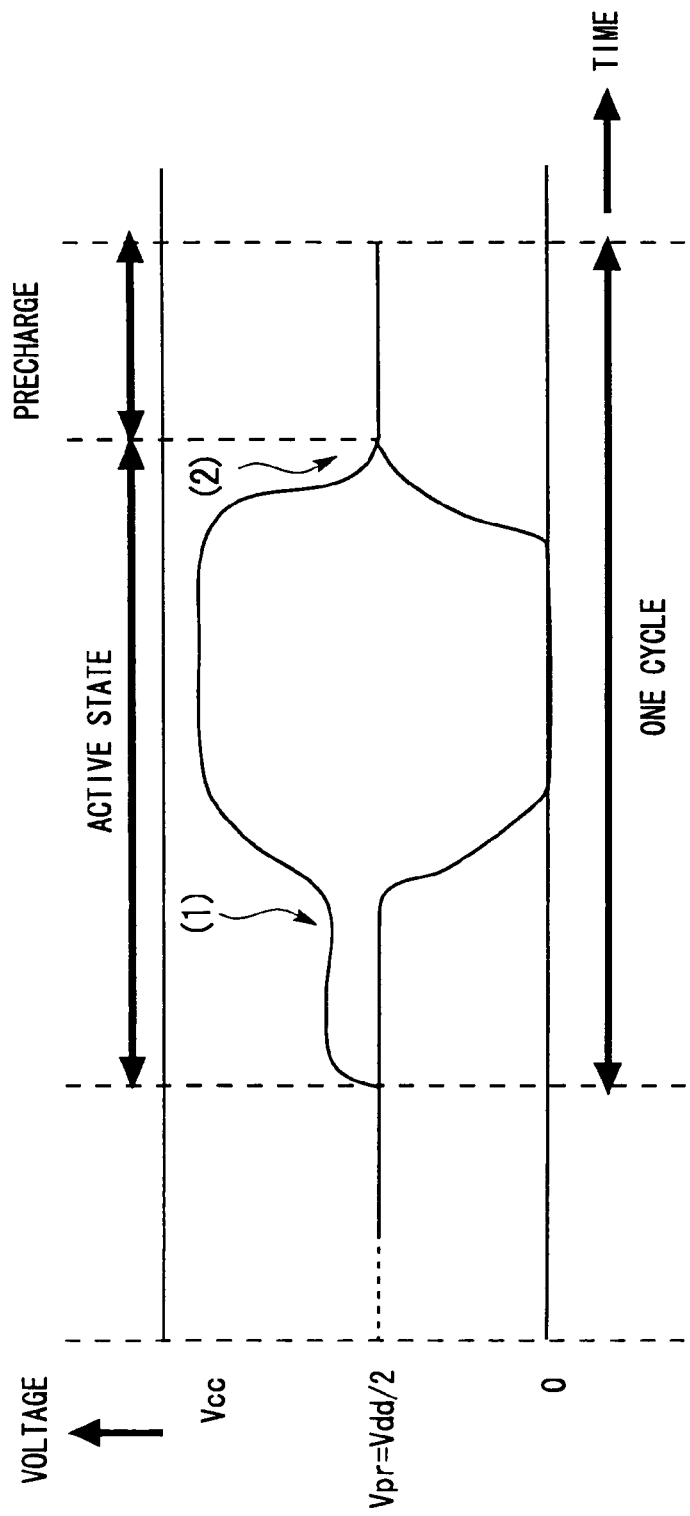
FIG. 6 is a timing chart showing potential change of bit lines in one cycle of reading data and performing precharge in a related Vcc/2 precharge system.
Figure 7:
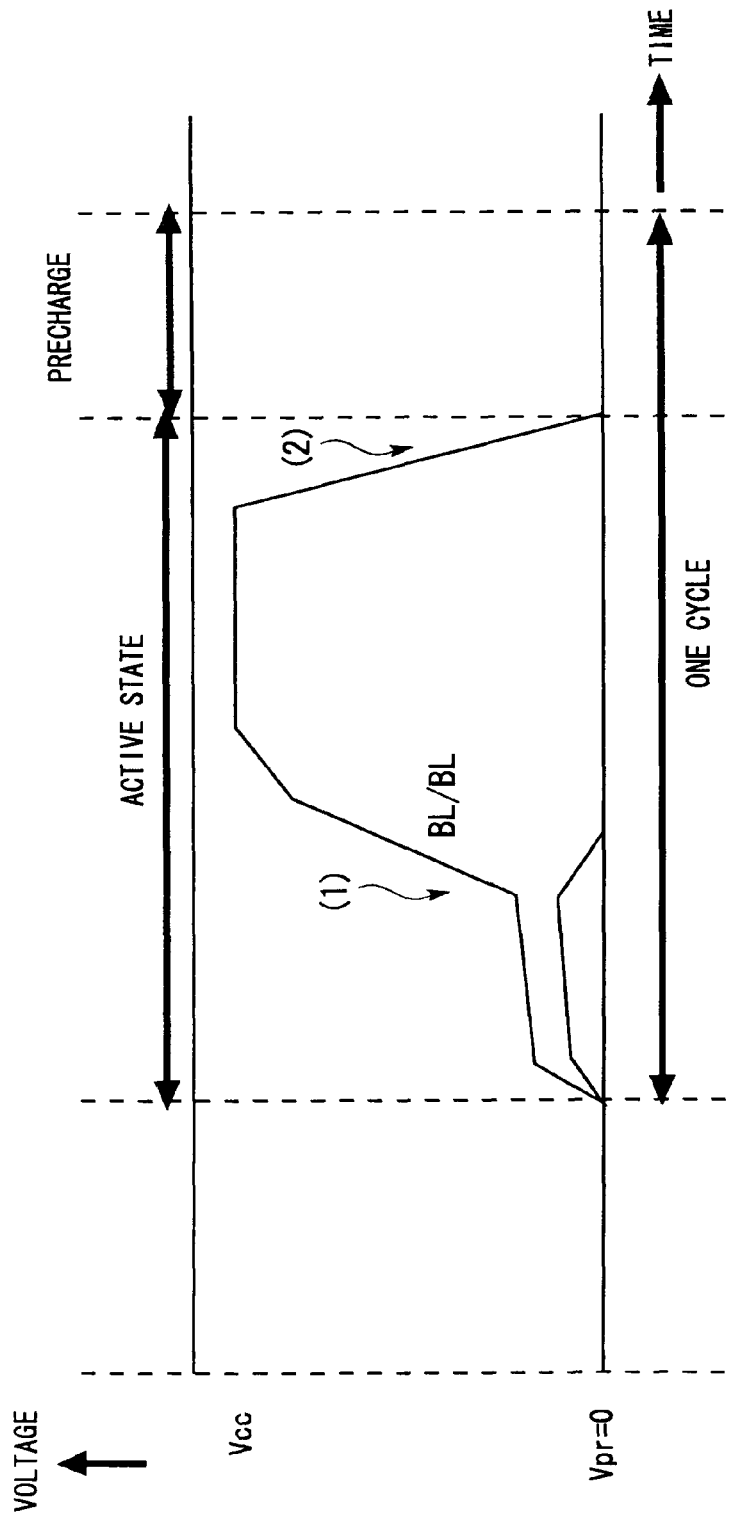
FIG. 7 is a timing chart showing potential change of bit lines in one cycle of reading data and performing precharge in a ground precharge system.

FIG. 3 is a timing chart showing the operation timing of the second exemplary embodiment. The operation of the second exemplary embodiment will be described with reference to FIG. 3.

The precharge activation signal φs is raised immediately after timing $t_{00}$. Then, the bit lines BL, $BL_B$ are equalized to Vcc/2 by the bit line precharge circuit 1.

Further, the connection points in the SFT sides of the level shifting capacitors SFTC are changed from the ground level to the value of $Vcc_2$ by the timing generator.

Note that, even when the shift capacitor drive signal SFT is changed, the connection points in the sides of the bit lines BL, $BL_B$ of the level shifting capacitors SFTC are kept to the level amplified in the sense amplifier.

The memory cell selection signal WL is activated immediately after timing $t_{11}$, and the charge stored in the memory cell 2 is reallocated between the bit lines BL, $BL_B$. The reallocation of the charge stored in the memory cell 2 is completed by timing $t_{22}$.

Then, the connection points in the SFT sides of the level shifting capacitors SFTC are switched from $Vcc_2$ to the ground level by the timing generator. Then, the charge is reallocated between the capacitance Cc of the capacitor SFTC and the parasitic capacitance Cbl of the bit lines BL, $BL_B$. In short, the potential of the bit line BL is reduced in accordance with the capacitance Cc of the level shifting capacitor SFTC as is similar to the first exemplary embodiment.

In this state, the sense amplifier activation signals SAP and SAN are activated.

The potential that sufficiently exceeds Vt of the sense amplifier is supplied at a time point at which the sense amplifier activation signal SAP is switched from "L" to "H". Thus, the sense amplifier 3 starts the detection operation in high speed.

Accordingly, the difference potential between the bit lines $BL$, $BL_B$ is amplified to Vcc-GND by timing $t_{33}$ by the sense amplifier 3.

The voltage between the gate and the source of the sense amplifier 3 can be set large also in the second exemplary embodiment, whereby high-speed operation and stabilization can be realized in the detection operation of the sense amplifier 3. Also in the second exemplary embodiment, the mechanism of the level shift is similar to that in the first exemplary embodiment. Thus, the first, second, and third problems stated above can be solved for the same reason.

Further, the operation timing of the shift capacitor drive signals SFT is not limited to the timing in the first exemplary embodiment but may be the timing in the second exemplary embodiment. Thus, the timing control can be freely selected, which makes the design process simple.

Note that the present invention is not limited to the above-described exemplary embodiments, but can be changed as appropriate without departing from the spirit of the present invention.

Although the description has been made on a case of reducing the potential of the bit line pair by the level shifting capacitor, the potential of the bit line pair can be increased by the level shifting capacitor.

For example, when the shift capacitor drive signal SFT is switched from the ground level to the high level after precharging the bit lines, the potential of the bit line pair is raised.

In this case, if the sense amplifier performs sensing operation with reference to Vcc, the gate bias can be increased and high-speed operation and stabilization can be realized in the detection operation of the sense amplifier.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor storage device comprising:
    a memory cell array in which a plurality of memory cells storing data are arranged;
    a plurality of word lines that selectively drive one of the memory cells in the memory cell array;
    a plurality of pairs of bit lines that transmit/receive data to/from the memory cell that is selected;
    a precharge circuit that precharges a bit line pair to about half of a power supply potential by equalizing potential of the bit line pair;
    a sense amplifier that is provided in accordance with each of the bit line pairs; and
    a level shift unit that shifts level of potential of the bit lines when the sense amplifier starts to read potential of the bit line pair, wherein
    the level shift unit comprises:
        level shifting capacitors, each of which having one electrode connected to each bit line, and forming one pair by two level shifting capacitors for each bit line pair; and
        a timing generator that is connected to each of the other electrodes of the level shifting capacitors in common, supplies a shift capacitor drive signal to a common node of the other electrodes, so as to change stored electricity amount of the level shifting capacitors at a predetermined timing.

2. The semiconductor storage device according to claim 1, wherein an activation period of the shift capacitor drive signal by the timing generator is immediately before a memory cell selection signal is activated.

3. The semiconductor storage device according to claim 1, wherein an activation period of the shift capacitor drive signal by the timing generator is immediately before the sense amplifier is activated.

4. The semiconductor storage device according to claim 1, wherein
    the level shift unit executes reallocation of charge between the bit line pair after precharge operation and the level shifting capacitor to shift potential level of the bit line pair, so as to make gate bias of the sense amplifier at a time of starting reading larger than at least half of power supply potential.

5. The semiconductor storage device according to claim 4, comprising reducing a bias level of the sense amplifier at a time of starting reading to a ground level by combination of values of capacitance of the level shifting capacitor, voltage of the sense amplifier activation signal, and counter voltage of the level shifting capacitor.

* * * * *